United States Patent
Liu et al.

(12) 
(10) Patent No.: US 6,248,641 B1
(45) Date of Patent: Jun. 19, 2001

(54) METHOD OF FABRICATING SHALLOW TRENCH ISOLATION

(75) Inventors: Lu-Min Liu, Hsinchu; Hsi-Chieh Chen, Taipei; Ping-Ho Lo, Hsinchu; Sheng-Hao Lin, Keelung, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/245,953

(22) Filed: Feb. 5, 1999

(51) Int. Cl.[7] .................................................. H01L 21/76
(52) U.S. Cl. ............................................. 438/400; 438/424
(58) Field of Search .................................... 438/270, 296, 438/400, 424, 432, 272, 286, 290

(56) References Cited

U.S. PATENT DOCUMENTS 5,899,719 * 5/1999 Hong ...................................... 438/289
5,981,353 * 11/1999 Tsai ....................................... 438/424
6,001,706 * 12/1999 Tan et al. .............................. 438/424

* cited by examiner

*Primary Examiner*—David Nelms
*Assistant Examiner*—Phuc T. Dang

(57) ABSTRACT

A method of fabricating a shallow trench isolation is disclosed. First, a pad oxide layer and a polysilicon layer are formed on a silicon substrate. The pad oxide layer and the polysilicon layer are etched to expose parts of the substrate. Then the exposed parts of the substrate are oxidized to form an oxide layer. Next, the oxide layer is etched back to form an oxide spacer on the side wall of the polysilicon. Then, a shallow trench is formed by etching the partly exposed substrate. Next, a dielectric layer is formed to fill the shallow trench and then etched back by CMP to stop on the polysilicon layer. Finally, the pad oxide layer and the polysilicon layer are removed. As a result, oxide spacers on the side wall of the shallow trench are formed to eliminate the kink-effect.

23 Claims, 5 Drawing Sheets

METHOD OF FABRICATING SHALLOW TRENCH ISOLATION

BACKGROUND OF THE INVENTION (1) Field of the Invention The present invention relates to a method of fabricating shallow trench isolation, and more particularly to a process for fabricating shallow trench isolation to solve the issue of kink effect.

(2) Description of the Related Art

In recent years, the sizes of the MOSFETs and capacitors have become continuously smaller so that the packing densities of these ICs have increased considerably. It is necessary to isolate all of the transistors in order to prevent the transistors from affecting one another. At the early stage, the method of Local Oxidation (LOCOS) was used as the isolation process. The method of LOCOS uses thermal oxidation to form a field oxide layer to isolate all of the transistors. To use LOCOS as isolation process has a serious drawback—bird's beak. The bird's beak, the lateral extension of field oxide during thermal oxidation process, will affect the subsequent process at the active regions. This issue is getting serious in the field of sub-micron and deep sub-micron technology. Therefore, a lot of new isolation processes were developed to substitute the method of LOCOS.

Shallow trench isolation is the first candidate to substitute LOCOS. A typical structure would be formed in the following manner: Referring now more particularly to FIG. 1A, a pad oxide layer 13 and a nitride layer 15 are sequentially formed on a silicon substrate 11. The pad oxide layer 13 and the nitride layer 15 are then patterned by the conventional photolithography and plasma etching techniques to define a shallow trench region 12 which separates active regions 14.

Next, a second oxide layer 17 is deposited to fill the shallow trenches as shown in FIG. 1A. An etching back step for removing part of the second oxide layer 17 is performed by chemical mechanical polishing (CMP) technique to provide a planarized surface. The CMP technique offers an advantage of whole wafer planarization without additional masking or coating steps. However, one of the difficulties encountered with CMP for trench planarization is "scratch" that occurs on the surface of the second oxide layer 17. When the second oxide layer 17 and the nitride layer 15 are polished simultaneously, "scratch" is formed because of the hardness of the nitride layer. Another difficulty encountered with CMP for trench planarization is the "kink effect". When the wet etching techniques are used to remove the nitride layer 15, the isotropic etching will form a recess 19 on the edge between the active region 14 and the shallow trench 12, as shown in FIG. 1B. As a result the recess 19 will form an oxide-recess 19a on the edge of the two sides of the shallow trench during oxidizing and etching process. Transistors built on such silicon substrates will have problems of abnormal turn-on or early turn-on due to the scratch and the kink effect.

SUMMARY OF THE INVENTION

Accordingly, it is a primary object of the present invention to provide a method of fabricating shallow trench isolation for high density integrated-circuit applications.

It is another object of the present invention to provide a method of fabricating shallow trench isolation by using a polysilicon layer as a stop layer to avoid the problem of "scratch" on a dielectric layer.

It is a further object of the present invention to provide a method of fabricating shallow trench isolation by using an oxide spacer to eliminate the kink effect.

These objects are accomplished by the fabrication process described below. Firstly, a pad oxide layer and a polysilicon layer are formed on a silicon substrate. The pad oxide layer and the polysilicon layer are etched to expose parts of the substrate. Then the exposed parts of the substrate are oxidized to form an oxide layer. Next, the oxide layer is etched back to form an oxide spacer on the side wall of the polysilicon. Then, shallow trench is formed by etching the partly exposed substrate. Next, a dielectric layer is formed to fill the shallow trench and etched back by CMP to stop on the polysilicon layer. Finally, the pad oxide layer and the polysilicon layer are removed. As a result, oxide spacers on the side wall of the shallow trench are formed to eliminate the kink-effect.

BRIEF DESCRIPTION OF THE DRAWINGS

The accompanying drawings form a material part of this description, in which.

DESCRIPTION OF THE PREFERRED EMBODIMENTS

The invention disclosed herein is directed to a method of fabricating shallow trench isolation of ICs. The accompanying drawings illustrate a partially completed integrated circuit device. In the following description, numerous details are set forth in order to provide a thorough understanding of the present invention. One skilled in the art will appreciate that variations of these specific details are possible while still achieving the results of the present invention. In other instance, well-known processing steps are not described in detail in order not to unnecessarily obscure the present invention.

Figure 2:
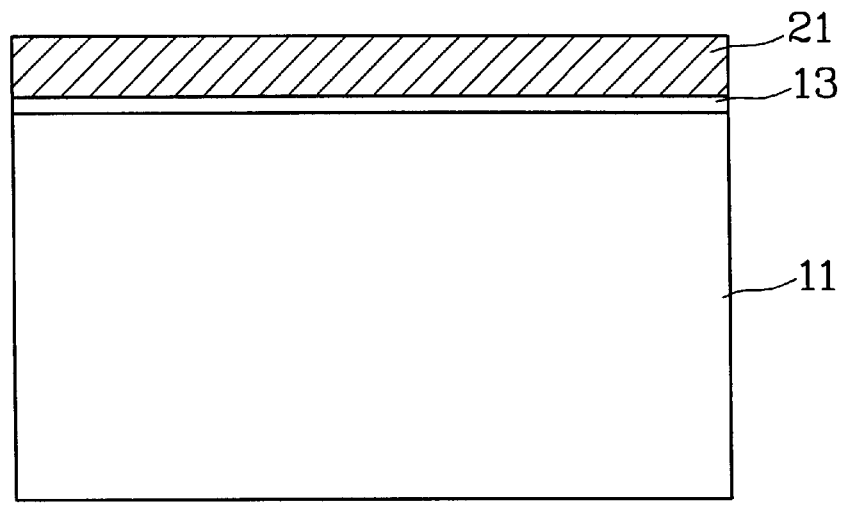
FIGS. 2A to 2G are cross sectional views showing the improved rounding corner of shallow trench isolation according to the embodiment of the present invention.
Figure 2:
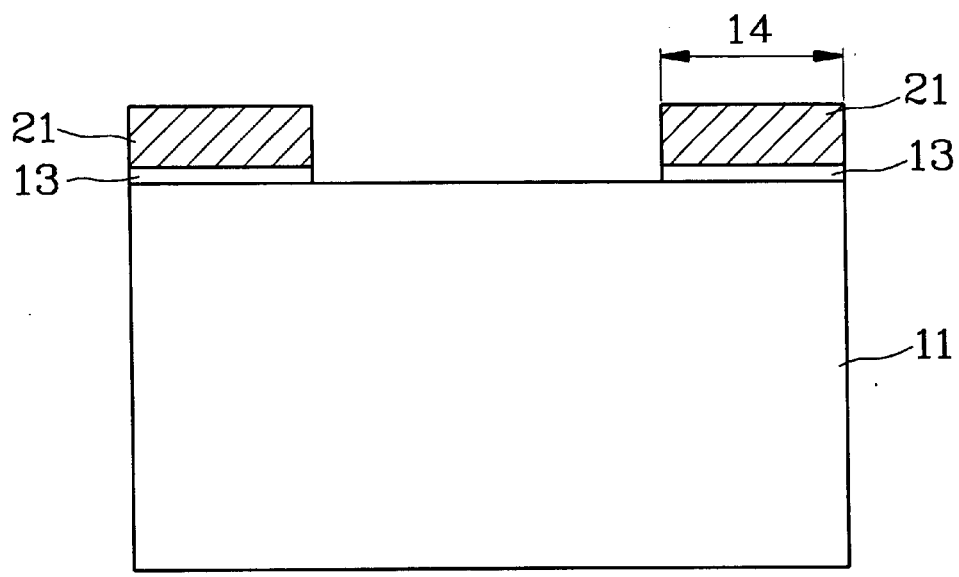
Figure 2:
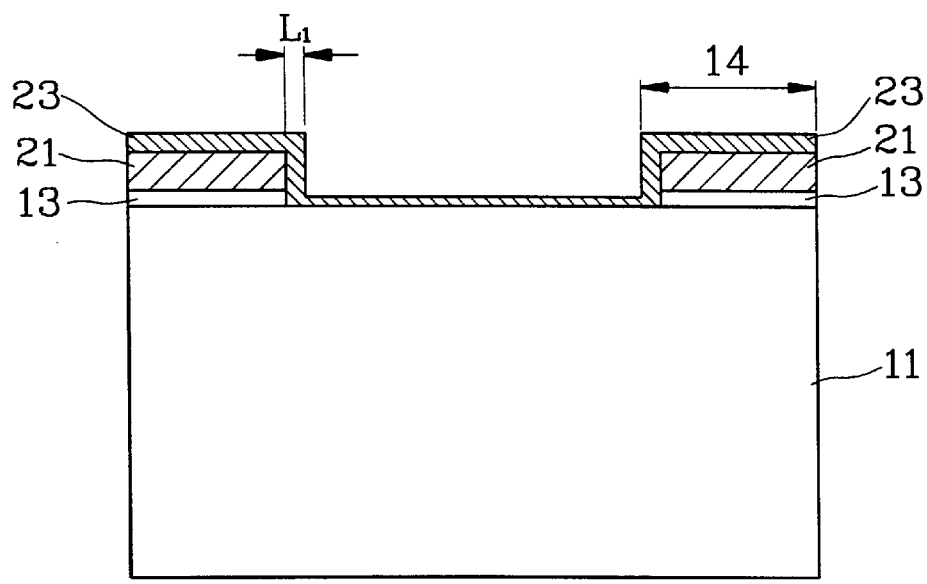
Figure 2:
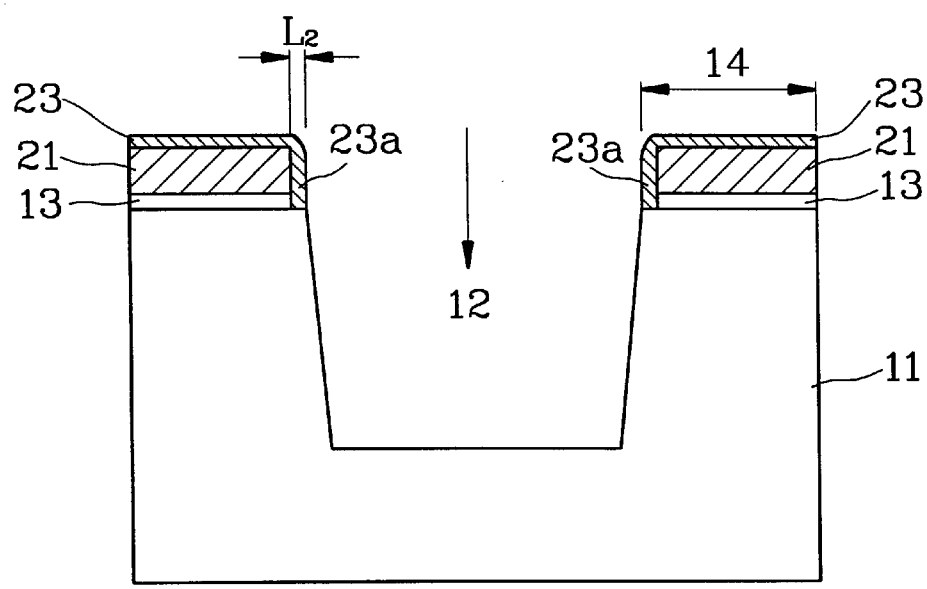
Figure 2:
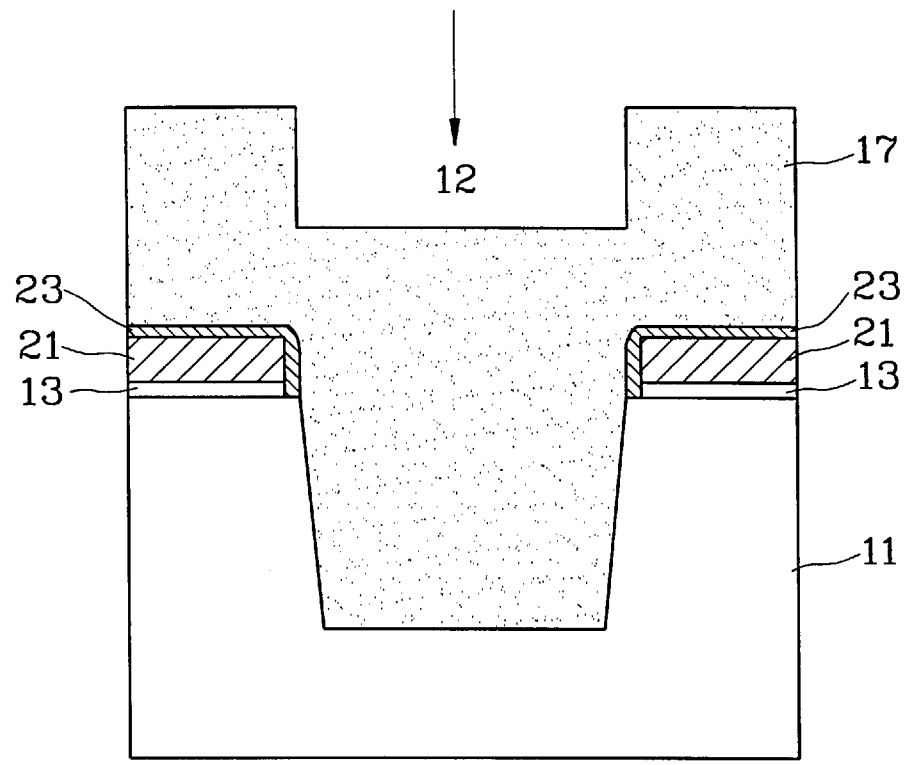
Figure 2:
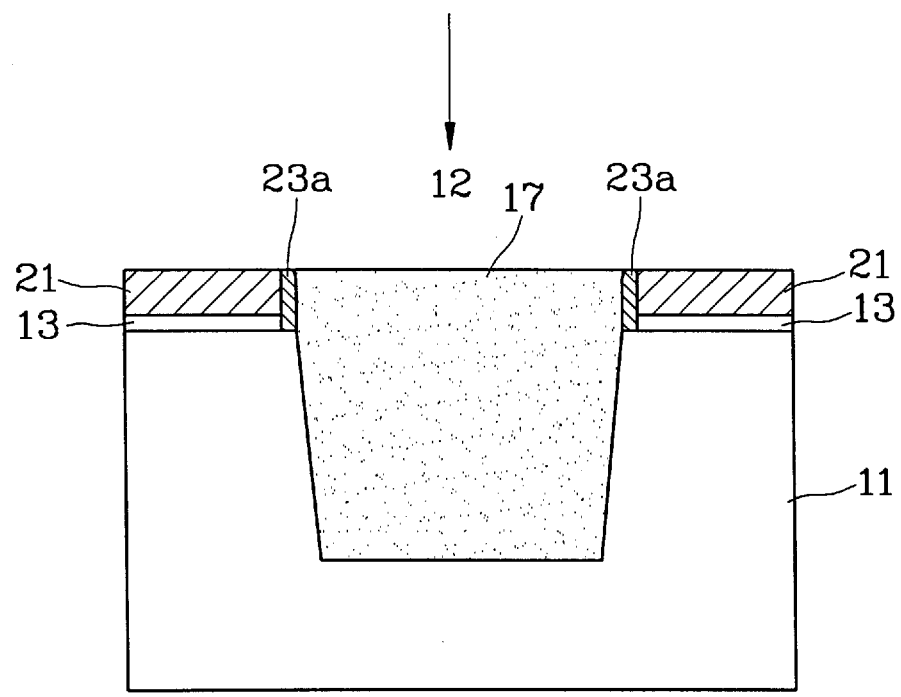
Figure 2:
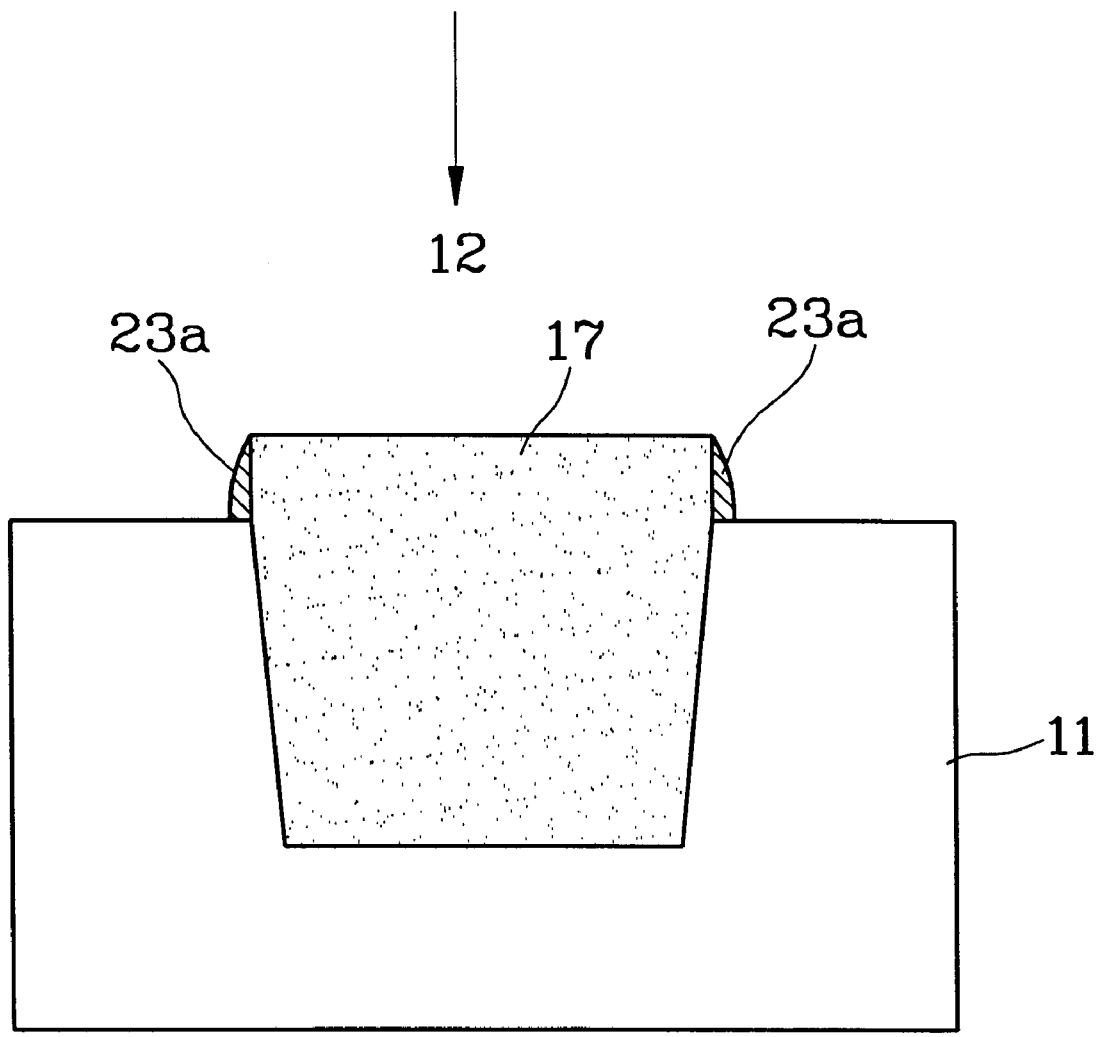

Referring now to FIGS. 2A–2G, there are shown schematic process cross-sectional views of a silicon substrate 11 where the device is built. First, a pad oxide layer 13, and a polysilicon layer 21 are sequentially formed on the substrate 11 as shown in FIG. 2A. The thickness of the polysilicon layer 21 is between 1000 to 2000 Angstroms. The polysilicon layer 21 is usually doped by $P^+$ with a doping concentration of $10^{19}$~$10^{20}$ $cm^{-3}$. The polysilicon layer 21 can also be formed by undoped polysilicon if the etch rate ratio of the polysilicon 21 to the pad oxide 13 is large enough. Thereafter, the polysilicon layer 21 and the pad oxide layer 13 are patterned by the conventional photolithography and etching techniques to define active device regions as shown in FIG. 2B.

Referring now to FIG. 2C, the top surface and the exposed side wall of the polysilicon layer 21, the exposed side wall of the pad oxide 13 and the exposed surface of the substrate 11 are oxidized to form an oxide layer 23 by using the thermal oxidation technique at a temperature range of between 850 to 950° C. The thickness of the oxide $L_1$ is about 600 Angstroms. The key point of the present invention is the formation of the oxide layer 23.

Figure 1:
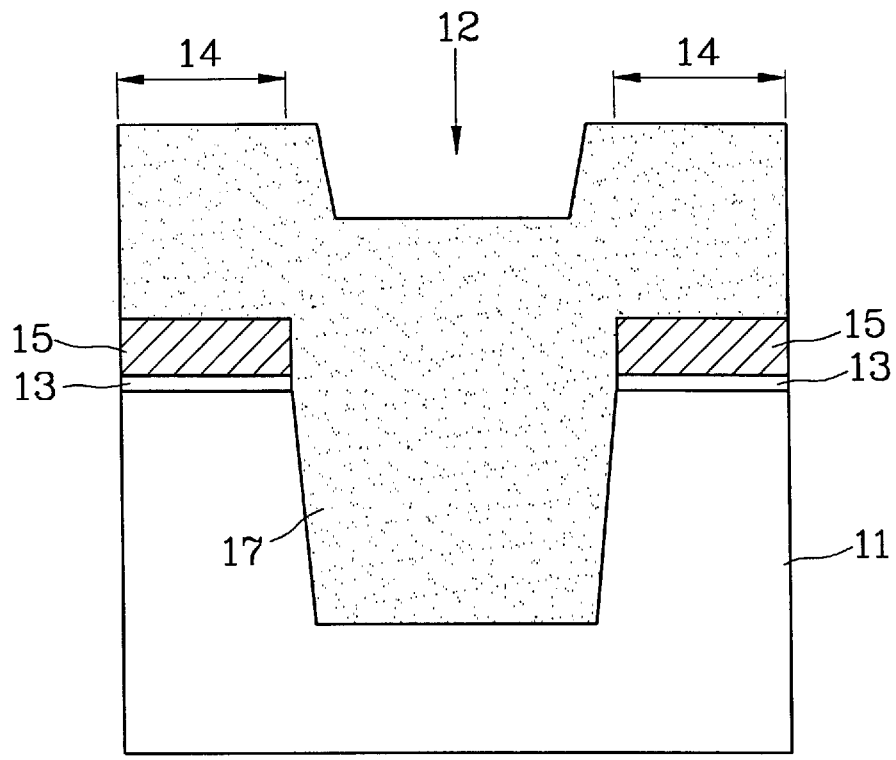
FIGS. 1A to 1B are cross sectional views showing the kink effect of a conventional shallow trench isolation.
Figure 1:
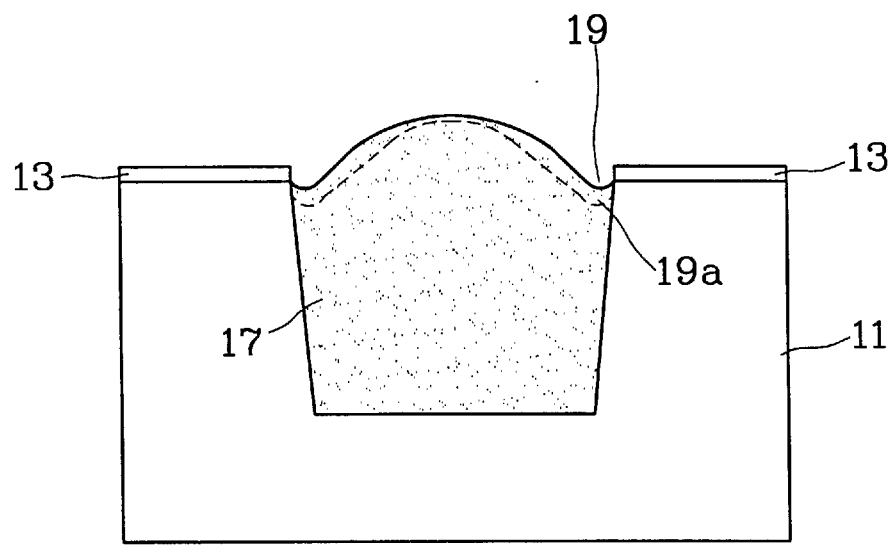

Next, referring now to FIG. 2D, a shallow trench region 12 which separates active device regions is formed by dry etching. The etching will start with pad oxide break through, and then change to next step with etching selectivity higher than 20 between Si and $SiO_2$. Therefore, the oxide layer 23 on the side wall of the pad oxide layer 13 and the polysilicon layer 21 will form an oxide spacer with a width $L_2$ of 300 to 800 Angstroms which can protect the two side of the shallow trench 12 from forming the concave as shown in FIG. 1B.

Next, a dielectric layer 17 is formed to fill into the shallow trenches 12. The dielectric layer 17 is silicon oxide formed by using plasma-enhanced chemical vapor deposition (PECVD). Then, the dielectric layer 17 is etched back by using the method of chemical mechanical polishing (CMP) as shown in FIG. 2F. The polysilicon layer 21 serves as an etching stop layer for this etching back process. Finally, the polysilicon layer 21 and the pad oxide layer 13 are removed, and a shallow trench isolation 12 is then obtained as shown in FIG, 2G.

The polysilicon 21 in the present invention is used to replace the silicon nitride used in the prior art because the polysilicon 21 is easy to form the oxide layer 23. Thereby the oxide layer 23 forms the oxide spacer 23a with a suitable width to protect the corner of shallow trenches 12 from forming the oxide-recess 19a as shown in FIG. 1B. Therefore, the oxide spacer 23a provides a good isolation structure and eliminates the problem of kink effect.

It is to be understood that although the present invention has been described with reference to a particular preferred embodiment, it should be appreciated that numerous modifications, variations and adaptations may be made without departing from the scope of the invention as defined in the claims.

What is claimed is:

1. A method of fabricating shallow trench isolation of integrated circuits, comprising the steps of:
    (a) providing a substrate covered by an undoped polysilicon layer;
    (b) defining active device regions on said substrate;
    (c) oxidizing the exposed parts of said substrate to form an oxide layer;
    (d) forming a shallow trench and an oxide spacer on the side wall of said undoped polysilicon layer by etching said substrate;
    (e) forming a dielectric layer to fill said shallow trenches;
    (f) etching back said dielectric layer to stop on said undoped polysilicon layer; and
    (g) removing said undoped polysilicon layer.

2. The method of claim 1, wherein said polysilicon layer is a $P^+$ doped polysilicon layer.

3. The method of claim 2, wherein said $P^+$ doped polysilicon layer has a dopant concentration of $10^{19} \sim 10^{20}$ atom/cm$^3$.

4. The method of claim 1, wherein said polysilicon layer is an undoped polysilicon layer.

5. The method of claim 1, wherein said polysilicon layer has a thickness of 1000 to 2000 Angstroms.

6. The method of claim 1, wherein said oxide spacer has a thickness of 300 to 800 Angstroms.

7. The method of claim 1, wherein said oxide layer is formed by plasma-enhanced chemical vapor deposition (PECVD).

8. The method of claim 1, wherein said shallow trench is formed by dry etching.

9. The method of claim 8, wherein said dry etching has an etching selectivity higher than 20 between Si and $SiO_2$.

10. The method of claim 1, wherein said etching back said dielectric layer in step (e) uses the method of chemical mechanical polishing (CMP).

11. The method of claim 1, wherein step (a) includes forming a pad oxide layer.

12. The method of claim 11, wherein step (b) includes etching said pad oxide layer and said undoped polysilicon layer.

13. The method of claim 11, wherein step (g) includes removing said pad oxide layer.

14. A method of fabricating shallow trench isolation of integrated circuits, comprising the steps of:
    (a) providing a substrate covered by a polysilicon layer;
    (b) defining active device regions on said substrate;
    (c) oxidizing the exposed parts of said substrate to form an oxide layer;
    (d) forming a shallow trench and an oxide spacer on the side wall of said polysilicon layer by etching said substrate;
    (e) forming a dielectric layer to fill said shallow trenches;
    (f) etching back said dielectric layer to stop on said undoped polysilicon layer; and
    (g) removing said undoped polysilicon layer;
    wherein said oxide layer is formed by plasma-enhanced chemical vapor deposition (PECVD).

15. The method of claim 14, wherein the polysilicon layer has a thickness of 1000 to 2000 Angstrom.

16. The method of claim 14, wherein the oxide spacer has a thickness of 300 to 800 Angstrom.

17. The method of claim 14, wherein the shallow trench is formed by dry etching.

18. The method of claim 17, wherein said dry etching has an etching selectivity higher than 20 between Si and $SiO_2$.

19. The method of claim 14, wherein said etching back said dielectric layer in step (e) uses the method of chemical mechanical polishing (CMP).

20. The method of claim 14, wherein step (a) includes forming a pad oxide layer.

21. The method of claim 20, wherein step (b) includes etching said pad oxide layer and said polysilicon layer.

22. The method of claim 20, wherein step (g) includes removing said pad oxide layer.

23. A method of fabricating shallow trench isolation of integrated circuits, comprising the steps of:
    (a) providing a substrate covered by a polysilicon layer;
    (b) defining active device regions on said substrate;
    (c) oxidizing the exposed parts of said substrate to form an oxide layer;
    (d) forming a shallow trench and an oxide spacer on the side wall of said polysilicon layer by etching said substrate;
    (e) forming a dielectric layer to fill said shallow trenches;
    (f) etching back said dielectric layer to stop on said undoped polysilicon layer; and
    (g) removing said undoped polysilicon layer;
    wherein said shallow trench is formed by dry etching which has an etching selectivity higher than 20 between Si and $SiO_2$.

* * * * *